(12) United States Patent
Muraoka et al.

(10) Patent No.: US 8,502,529 B2
(45) Date of Patent: Aug. 6, 2013

(54) MAGNETIC SENSOR DEVICE

(75) Inventors: Daisuke Muraoka, Chiba (JP); Minoru Ariyama, Chiba (JP); Tomoki Hikichi, Chiba (JP); Manabu Fujimura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 386 days.

(21) Appl. No.: 12/956,544

(22) Filed: Nov. 30, 2010

(65) Prior Publication Data

US 2011/0241662 A1 Oct. 6, 2011

(30) Foreign Application Priority Data

Dec. 2, 2009 (JP) ................................. 2009-274834

(51) Int. Cl.
*G01R 33/02* (2006.01)
(52) U.S. Cl.
USPC ............... 324/244; 324/207.25; 324/207.21; 324/219; 324/228; 324/235; 324/207.2; 324/207.26; 324/754.17; 324/754.29
(58) Field of Classification Search
USPC ............... 324/219, 228, 235, 246–247, 260, 324/262, 750.12, 750.21, 754.17, 754.29, 324/173, 179, 144, 207.2, 207.11, 207.13, 324/207.25, 207.26
See application file for complete search history.

(56) References Cited

U.S. PATENT DOCUMENTS

| 7,834,616 B2 * | 11/2010 | Stolfus et al. ................ 324/174 |
| 2003/0205996 A1 | 11/2003 | Hara et al. |
| 2008/0143326 A1 * | 6/2008 | Voisine et al. ........... 324/207.26 |
| 2008/0143327 A1 * | 6/2008 | Voisine et al. ........... 324/207.26 |
| 2009/0033317 A1 * | 2/2009 | Hayashi .................... 324/207.21 |

FOREIGN PATENT DOCUMENTS

JP 2001-337147 A 12/2001

* cited by examiner

*Primary Examiner* — Arleen M Vazquez
*Assistant Examiner* — Son Le
(74) *Attorney, Agent, or Firm* — Brinks Hofer Gilson & Lione

(57) ABSTRACT

Provided is a magnetic sensor device capable of suppressing a variation in determination for detection or canceling of a magnetic field intensity, which is caused by noise generated from respective constituent elements included in the magnetic sensor device and external noise, to thereby achieve high-precision magnetic reading. The magnetic sensor device includes: a first D-type flip-flop and a second D-type flip-flop each having an input terminal connected to an output terminal of a comparator; an XOR circuit having a first input terminal and a second input terminal which are connected to an output terminal of the first D-type flip-flop and an output terminal of the second D-type flip-flop, respectively; a selector circuit; and a third D-type flip-flop having an input terminal connected to an output terminal of the selector circuit. The selector circuit includes: a first input terminal (A) and a second input terminal (B) which are connected to the output terminal of the second D-type flip-flop and an output terminal of the third D-type flip-flop, respectively; and a select terminal connected to an output terminal of the XOR circuit. The selector circuit selectively outputs input signals from the first input terminal (A) and the second input terminal (B), according to an output of the XOR circuit.

12 Claims, 5 Drawing Sheets

MAGNETIC SENSOR DEVICE

RELATED APPLICATIONS

This application claims priority under 35 U.S.C. §119 to Japanese Patent Application No. 2009-274834 filed on Dec. 2, 2009, the entire content of which is hereby incorporated by reference.

BACKGROUND OF THE INVENTION

1. Technical Field

The present invention relates to a magnetic sensor device for converting a magnetic field intensity into an electric signal, and more particularly to a magnetic sensor device to be employed as a sensor for detecting an open/close state used in a flip phone, a notebook computer, or the like, or a sensor for detecting a rotational position of a motor.

2. Background Art

A magnetic sensor device has been employed as a sensor for detecting the open/close state used in a flip phone, a notebook computer, or the like, or a sensor for detecting a rotational position of a motor (for example, refer to Japanese Patent Application Laid-open No. 2001-337147). A circuit diagram of the magnetic sensor device is illustrated in FIG. 5.

In the magnetic sensor device, a magnetoelectric conversion element (for example, Hall element) outputs a voltage proportional to a magnetic field intensity or a magnetic flux density, an amplifier amplifies the output voltage, a comparator determines the voltage, and outputs a binary signal of an H signal or an L signal. The output voltage of the magnetoelectric conversion element is minute, and hence, easily affected by an offset voltage (element offset voltage) of the magnetoelectric conversion element, an offset voltage (input offset voltage) of the amplifier or the comparator, or noise within the conversion device, which leads to a problem. The element offset voltage is mainly generated by a stress or the like exerted on the magnetoelectric conversion element by a package. The input offset voltage is mainly generated by a characteristic variation of an element that forms an input circuit of the amplifier. The noise is mainly generated by a flicker noise of a monolithic transistor that forms a circuit, or a thermal noise of the monolithic transistor or a resistive element.

In order to reduce an influence of the above-mentioned offset voltage of the magnetoelectric conversion element or the amplifier, the magnetic sensor device illustrated in FIG. 5 is configured as follows. The magnetic sensor device illustrated in FIG. 5 is configured to include a Hall element 1, a switching circuit 2 that switches between a first detection state and a second detection state of the Hall element 1, a differential amplifier 3 that amplifies a voltage difference (V1−V2) of two output terminals of the switching circuit 2, a capacitor C1 having one end connected to one output terminal of the differential amplifier 3, a switch S1 connected between another output terminal of the differential amplifier 3 and another end of the capacitor C1, a comparator 4, and a D-type flip-flop D1. In the first detection state, a supply voltage is input from terminals A and C, and a detection voltage is output from terminals B and D. In the second detection state, the supply voltage is input from the terminals B and D, and the detection voltage is output from the terminals A and C.

It is assumed that a differential output voltage of the magnetoelectric conversion element is Vh, a gain of the differential amplifier is G, and the input offset voltage of the differential amplifier is Voa. In the first detection state, the switch S1 is turned on, and the capacitor C1 is charged with $Vc1=V3-V4=G(Vh1+Voa)$. Then, in the second detection state, the switch S1 is turned off, and $Vc2=V3-V4=G(-Vh2+Voa)$ is output. Here, $V5-V6=V3-Vc1-V4=Vc2-Vc1=-G(Vh1+Vh2)$ is satisfied, to thereby offset the influence of the input offset voltage. Further, the detection voltages Vh1 and Vh2 of the magnetoelectric conversion element generally have an in-phase valid signal component and a reverse-phase element offset component, and hence the influence of the element offset component is also removed from the above-mentioned output voltage. An applied magnetic field and a reference voltage are compared with each other by the comparator and an output result obtained by the comparison is latched. In the case illustrated in FIG. 5, the reference voltage is an in-phase voltage in the magnetoelectric conversion element, which may be arbitrarily set by an additional circuit.

SUMMARY OF THE INVENTION

However, the conventional magnetic sensor device as described above has a problem that, the influence of noise (flicker noise and thermal noise) generated in the respective constituent elements included in the sensor device and the influence of external noise cannot be completely suppressed, and hence a detected magnetic field intensity varies. In particular, noise generated in an input terminal portion of the differential amplifier 3 is amplified and thus becomes a main factor.

Therefore, an object of the present invention is to provide a magnetic sensor device capable of latching a plurality of times an output signal of a comparator at certain intervals and performing signal matching, so as to suppress the influence of noise, to thereby detect a magnetic field intensity with high precision.

In order to solve the above-mentioned problem inherent the related art, the magnetic sensor device according to the present invention is configured as follows.

A magnetic sensor device for generating a logic output according to a magnetic field intensity, includes: a magnetoelectric conversion element to which the magnetic field intensity is applied; a comparator for comparing amplified output signals input thereto from the magnetoelectric conversion element, and outputting a comparison result; a first D-type flip-flop and a second D-type flip-flop each including an input terminal connected to an output terminal of the comparator; an XOR circuit including input terminals connected to an output terminal of the first D-type flip-flop and an output terminal of the second D-type flip-flop; a third D-type flip-flop; and a selector circuit including a first input terminal connected to the output terminal of the second D-type flip-flop and a second input terminal connected to an output terminal of the third D-type flip-flop, for selectively outputting, to the third D-type flip-flop, an input signal from the second D-type flip-flop and an input signal from the third D-type flip-flop, according to an output of the XOR circuit.

According to the magnetic sensor device of the present invention, a variation in determination for detection or canceling of a magnetic field intensity, which is caused by noise generated from respective constituent elements included in the magnetic sensor device and external noise, may be reduced. Therefore, the present invention may provide a magnetic sensor device capable of detecting and canceling the magnetic field intensity with high precision.

DETAILED DESCRIPTION OF THE PREFERRED EMBODIMENTS

Embodiments of the present invention are described below in detail with reference to the accompanying drawings. A magnetic sensor device according to the present invention is widely used as a sensor for detecting a state of a magnetic field intensity, such as a sensor for detecting an open/close state in a flip phone or a notebook computer, or a sensor for detecting a rotational position of a motor. In the following embodiments, a magnetic sensor device using a magnetoelectric conversion element is described. Alternatively, however, a conversion device according to the present invention may employ a conversion element that similarly outputs a voltage according to acceleration or a pressure, in place of the magnetoelectric conversion element that outputs a voltage according to the magnetic field intensity.

Embodiment 1

Figure 1:
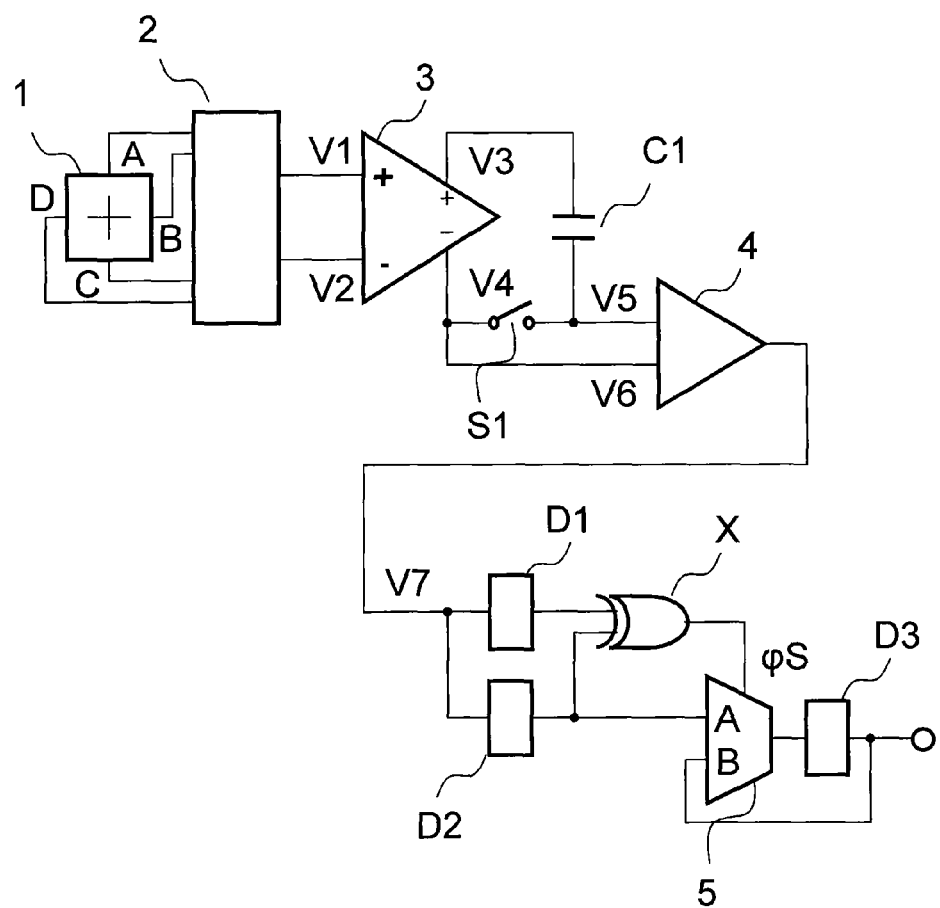
FIG. 1 is a circuit diagram illustrating a magnetic sensor device according to Embodiment 1 of the present invention.

FIG. 1 is a circuit diagram of a magnetic sensor device according to Embodiment 1 of the present invention. The magnetic sensor device according to Embodiment 1 includes a Hall element 1 serving as a magnetoelectric conversion element, a switching circuit 2, a differential amplifier 3, a comparator 4, a selector circuit 5, a D-type flip-flop, and an XOR circuit.

The Hall element 1 has a first terminal pair A-C and a second terminal pair B-D. The switching circuit 2 has four input terminals connected to the respective terminals A, B, C, and D of the Hall element 1, a first output terminal, and a second output terminal. The differential amplifier 3 has a first input terminal and a second input terminal which are connected to the first output terminal and the second output terminal of the switching circuit 2, respectively, a first output terminal, and a second output terminal. The magnetic sensor device further includes a capacitor C1 which has one end connected to the first output terminal of the differential amplifier 3, a switch S1 connected between the second output terminal of the differential amplifier 3 and another end of the capacitor C1. The magnetic sensor device further includes a first D-type flip-flop D1 and a second D-type flip-flop D2 each having an input terminal connected to an output terminal of the comparator 4, an XOR circuit "X" having a first input terminal and a second input terminal which are connected to an output terminal of the first D-type flip-flop D1 and an output terminal of the second D-type flip-flop D2, respectively, and a third D-type flip-flop D3 having an input terminal connected to an output terminal of the selector circuit 5. The selector circuit 5 has a first input terminal "A" and a second input terminal "B" connected to the output terminal of the second D-type flip-flop D2 and an output terminal of the third D-type flip-flop D3, respectively, and a select terminal φS connected to an output terminal of the XOR circuit "X". The selector circuit 5 selectively outputs input signals from the first input terminal "A" and the second input terminal "B", in response to an output of the XOR circuit "X".

Figure 6:
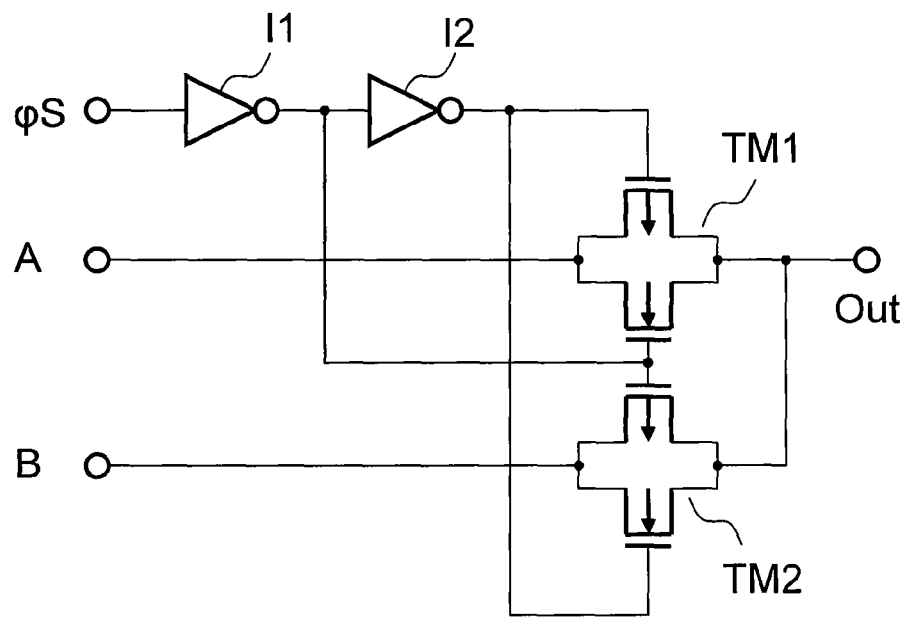
FIG. 6 is a circuit diagram illustrating an example of a selector circuit.

FIG. 6 is a circuit diagram illustrating an example of the selector circuit 5. The selector circuit 5 includes, for example, two transmission gates TM1 and TM2 and two inverters I1 and I2. The two transmission gates TM1 and TM2 are ON/OFF-controlled in response to an H/L input signal from the select terminal φS, to thereby perform a function of transferring a signal from one of the first input terminal "A" and the second input terminal "B", to the output terminal.

The switching circuit 2 has a function of switching between a first detection state in which the supply voltage is input to the first terminal pair A-C of the Hall element 1 while the detection voltage is output from the second terminal pair B-D of the Hall element 1, and a second detection state in which the supply voltage is input to the second terminal pair B-D while the detection voltage is output from the first terminal pair A-C.

Figure 7:
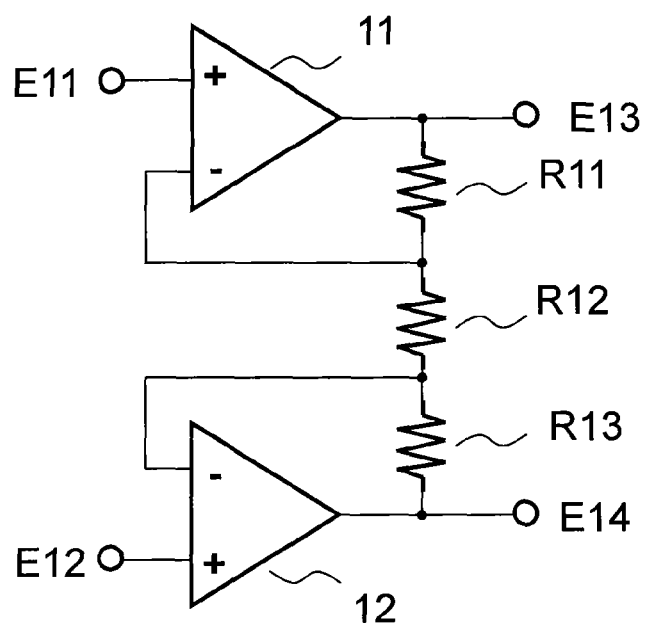
FIG. 7 is a circuit diagram illustrating an example of a differential amplifier.

FIG. 7 is a circuit diagram illustrating an example of the differential amplifier 3. The differential amplifier 3 is typically configured as an instrumentation amplifier. The differential amplifier 3 has differential amplifiers 11, 12, and resistors R11, R12, R13. The differential amplifiers 11 and 12 each function as a noninverting amplifier. The differential amplifier 3 has the first input terminal connected to a noninverting input terminal of the differential amplifier 11, the second input terminal connected to a noninverting input terminal of the differential amplifier 12, the first output terminal connected to an output terminal of the differential amplifier 11, and the second output terminal connected to an output terminal of the differential amplifier 12. The differential amplifier 3 is configured as such an instrumentation amplifier, to thereby suppress the influence of in-phase noise in the differential input.

Figure 2:
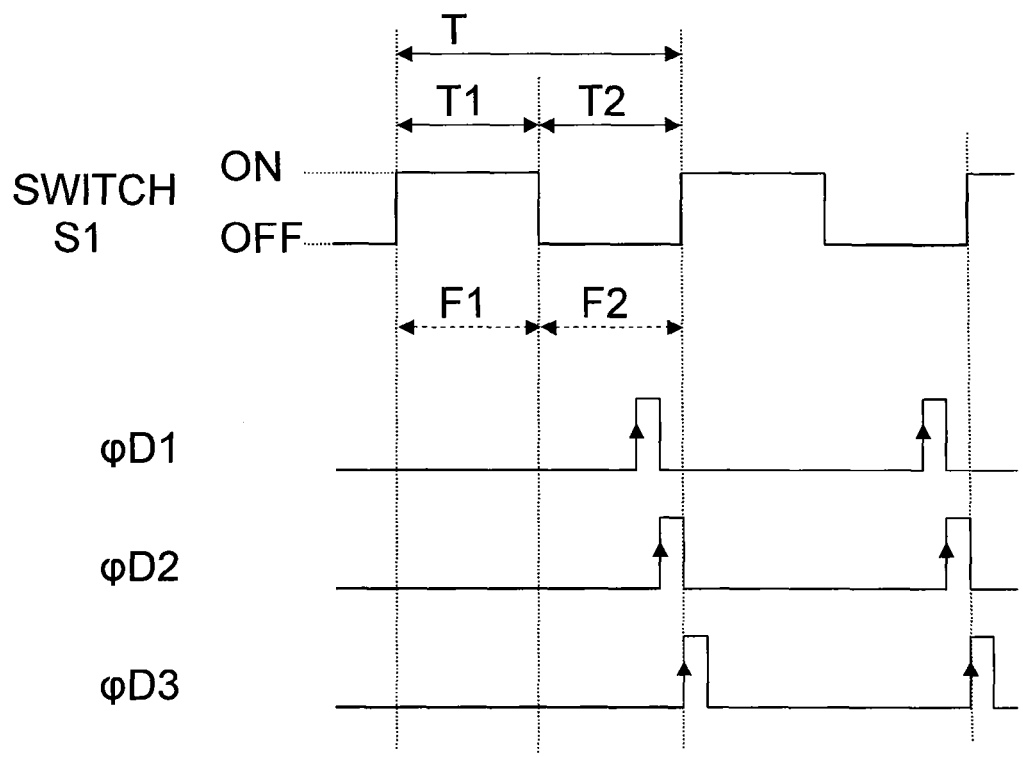
FIG. 2 is a timing chart illustrating control signals according to Embodiment 1 of the present invention.

Next, an operation of the magnetic sensor device according to Embodiment 1 is described. FIG. 2 is a timing chart illustrating control signals in the magnetic sensor device according to Embodiment 1. In FIG. 2, φDm indicates a latch clock signal input to an m-th D-type flip-flop Dm. Unless otherwise specified, each D-type flip-flop latches input data at the rising of the latch clock signal from a low (L) level to a high (H) level.

One period T in detection operation is divided into a first detection state T1 and a second detection state T2 according to the operation of the above-mentioned switching circuit 2. The period T of the detection operation is also divided into a sample phase F1 and a comparison phase F2 through the opening and closing the switch S1. In the sample phase F1, the offset components of the Hall element 1 and the differential amplifier 3 are stored in the capacitor C1. In the comparison phase F2, a voltage determined according to the magnetic field intensity is compared with the detection voltage level. Here, assuming that a differential output voltage of the magnetoelectric conversion element is expressed by Vh, an amplification factor of the differential amplifier is expressed by G, and an input offset voltage of the differential amplifier is expressed by Voa.

In the sample phase F1, the Hall element 1 goes into the first detection state T1 and the switch S1 is turned on. When the switch S1 is turned on, the capacitor C1 is charged with a voltage as follows.

$$Vc1=(V3-V4)=G(Vh1+Voa) \quad (1)$$

Subsequently, in the comparison phase F2 (second detection state T2), the switch S1 is turned off, and hence the following voltage is output.

$$Vc2=(V3-V4)=G(-Vh2+Voa) \quad (2)$$

In this case, the following expression applies.

$$V5-V6=V3-Vc1-V4=Vc2-Vc1=-G(Vh1+Vh2) \quad (3)$$

Therefore, the influence of the input offset voltage is canceled out. Detection voltages Vh1 and Vh2 of the magnetoelectric conversion element generally have in-phase effective signal components and inverted-phase element offset components, and hence the influence of the element offset components is also removed from the output voltage described above.

In the comparison phase F2, the detection voltage component of the applied magnetic field intensity, which is expressed by Expression (3), is compared with a reference voltage by the comparator 4, and an H signal (VDD) or an L signal (GND) is output. The reference voltage is an in-phase voltage in the magnetoelectric conversion element. The reference voltage may be arbitrarily set by an additional circuit. The output signal from the comparator 4 is latched two times at different timings by the two D-type flip-flops D1 and D2 connected to the output terminal of the comparator 4. Only when the two output values are equal to each other in the XOR circuit connected to the output terminals of the two D-type flip-flops D1 and D2, the output signal of the comparator 4 is output through the selector circuit and latched by the third D-type flip-flop D3. In contrast to this, when the two output values from the two D-type flip-flops D1 and D2 are different from each other, a result which is obtained by the previous detection and held in the third D-type flip-flop D3 is directly output without any change.

In this manner, a result obtained by determination on the magnetic field intensity may be prevented from being varied due to internal noise or external noise of the magnetic sensor device.

Embodiment 2

Figure 3:
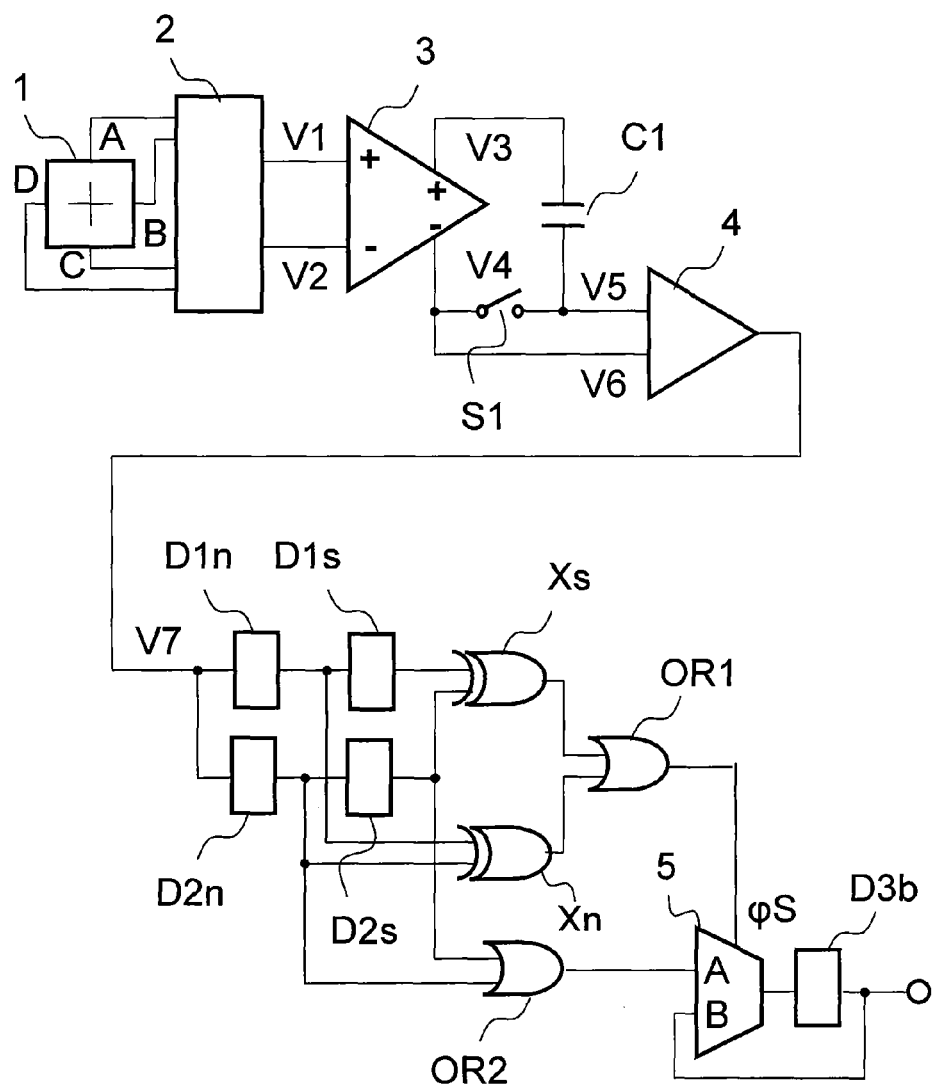
FIG. 3 is a circuit diagram illustrating a magnetic sensor device according to Embodiment 2 of the present invention.

FIG. 3 is a circuit diagram illustrating a magnetic sensor device according to Embodiment 2 of the present invention. The magnetic sensor device according to Embodiment 2 detects magnetic field intensities for both of the S-pole and the N-pole (performs bipolar detection).

The magnetic sensor device according to Embodiment 2 includes a Hall element 1 serving as a magnetoelectric conversion element, a switching circuit 2, a differential amplifier 3, a comparator 4, a selector circuit 5, a D-type flip-flop, an XOR circuit, and an OR circuit.

The magnetic sensor device further includes: a first D-type flip-flop D1n and a second D-type flip-flop D2n each having an input terminal connected to the output terminal of the comparator 4; a third D-type flip-flop D1s having an input terminal connected to an output terminal of the first D-type flip-flop D1n; and a fourth D-type flip-flop D2s having an input terminal connected to an output terminal of the second D-type flip-flop D2n. The magnetic sensor device further includes: a first XOR circuit Xs having a first input terminal and a second input terminal connected to an output terminal of the third D-type flip-flop D1s and an output terminal of the fourth D-type flip-flop D2s, respectively; and a second XOR circuit Xn having a first input terminal and a second input terminal connected to the output terminal of the first D-type flip-flop D1n and the output terminal of the second D-type flip-flop D2n, respectively. The magnetic sensor device further includes: a first OR circuit OR1 having a first input terminal and a second input terminal connected to an output terminal of the first XOR circuit Xs and an output terminal of the second XOR circuit Xn, respectively; a second OR circuit OR2 having a first input terminal and a second input terminal connected to the output terminal of the second D-type flip-flop D2n and the output terminal of the fourth D-type flip-flop D2s, respectively; and a fifth D-type flip-flop D3b having an input terminal connected to an output terminal of the selector circuit 5. The selector circuit 5 includes: a first input terminal "A" and a second input terminal "B" which are connected to an output terminal of the second OR circuit OR2 and an output terminal of the fifth D-type flip-flop D3b, respectively; and a select terminal φS connected to an output terminal of the first OR circuit OR1. The selector circuit 5 selectively outputs input signals from the first input terminal "A" and the second input terminal "B" in response to an output of the first OR circuit OR1. Note that an AND circuit may be employed, in place of the second OR circuit OR2, depending on whether the comparator 4 generates an H signal or an L signal when the magnetic field intensity is detected.

The Hall element 1, the switching circuit 2, the differential amplifier 3, the comparator 4 have the same structures as those described in Embodiment 1, and hence the description thereof is omitted. The detailed description of the selector circuit 5, the switching circuit 2, and the differential amplifier 3 is also omitted.

Figure 4:
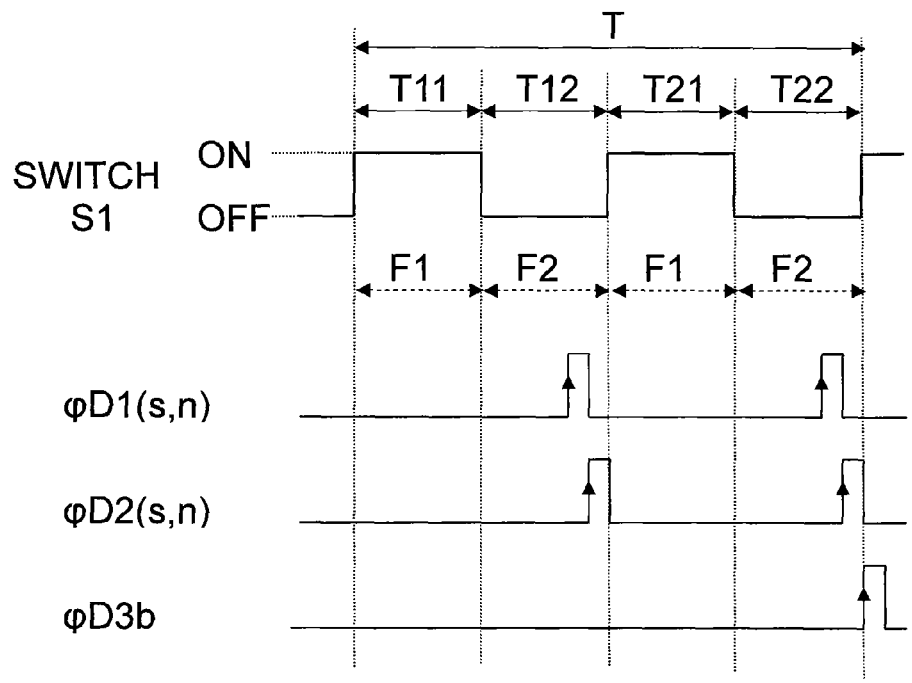
FIG. 4 is a timing chart illustrating control signals according to Embodiment 2 of the present invention.
Figure 5:
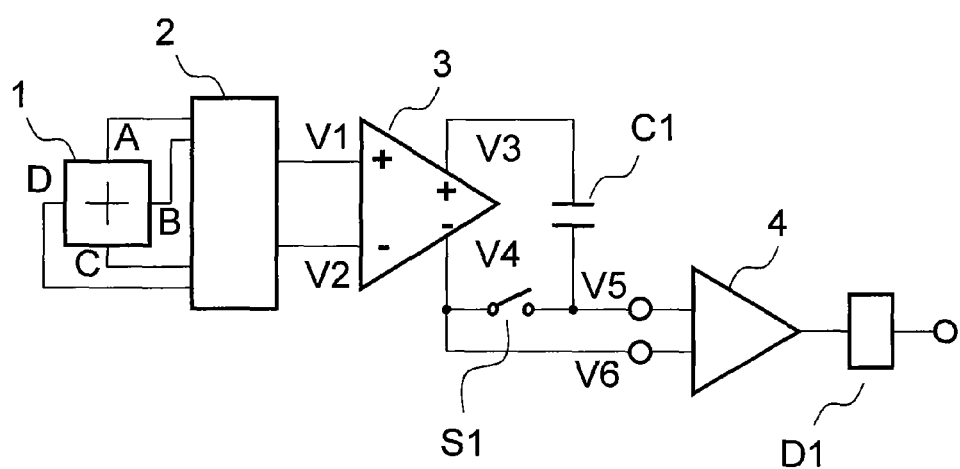
FIG. 5 is a circuit diagram illustrating a conventional magnetic sensor device.

Next, an operation of the magnetic sensor device according to Embodiment 2 is described. FIG. 4 is a timing chart illustrating control signals in the magnetic sensor device according to Embodiment 2. When performing bipolar detection, the detection period is repeated two times and the results are combined to be determined. The period T of the detection operation is divided into first detection periods T11 and T12 and second detection periods T21 and T22, based on the operation of the switching circuit 2.

Firstly, in the comparison phase F2 for the first detection periods T11 and T12 (for example, S-pole detection periods), an H signal (VDD) or an L signal (GND) is output as an output signal from the comparator 4, and then latched two times at different timings by the two D-type flip-flops D1n and D2n connected to the output terminal of the comparator 4. Next, in the comparison phase F2 for the second detection periods T21 and T22 (for example, N-pole detection periods), the output signal from the comparator 4 is latched two times at different timings by the two D-type flip-flops D1n and D2n. In this case, the D-type flip-flop D1n is connected in series to the D-type flip-flop D1s and the D-type flip-flop D2n is connected in series to the D-type flip-flop D2s, and hence data items which are held in the D-type flip-flops D1n and D2n during the first detection periods T11 and T12 are transferred to the D-type flip-flops D1s and D2s, respectively. An output of the XOR circuit connected to the two output terminals of the D-type flip-flops D1n and D2n and an output of the XOR circuit connected to the two output terminals of the D-type flip-flops D1s and D2s are logically ORed, to thereby obtain a result as the select signal of the selector circuit. With respect to a detection signal of a magnetic field intensity, when a magnetic field intensity for one of the S-pole and the N-pole is detected, detection determination is made, and hence the outputs of the D-type flip-flops D2n and D2s are ORed or ANDed, to thereby obtain one of inputs to the selector circuits. In this manner, only when values of the output signal latched two times during each of the S-pole detection period and the N-pole detection period are matched with each other, the output signal subjected to the detection determination is output from the selector circuit and latched by the D-type flip-flop D3b. In contrast, when values of the output signal latched two times during any one of the S-pole detection period and the N-pole detection period are not matched with each other, a result which is obtained by previous detection and held in the D-type flip-flop D3b is directly output without any change.

In this manner, a result obtained by determination on the magnetic field intensity may be prevented from being varied due to internal noise or external noise of the magnetic sensor device.

In Embodiments 1 and 2, the output terminal of the comparator 4 is connected to two D-type flip-flops. However, the output terminal of the comparator 4 may be connected to three or more D-type flip-flops. In this case, the result obtained by previous detection is held unless all output values are matched with one another. Therefore, as the number of D-type flip-flops connected in parallel increases, the influence of noises may be further suppressed.

The magnetic sensor device according to each of the embodiments has the circuit structure connecting from the Hall element 1 to the comparator 4 as illustrated in FIGS. 1 and 3. However, the present invention is not limited to the circuit structure. For example, the voltage to be input to the comparator 4 may be a voltage relative to a reference voltage supplied from a circuit for generating a reference voltage.

In the timing charts illustrated in FIGS. 2 and 4, the output of the comparator 4 is latched two times during the same comparison phase period. However, timings for performing latching two times are not necessarily within the same comparison phase period. For example, latching may be performed in the following manner. During the detection period T for the first time, latching is performed only one time in response to the latch clock signal φD1. Subsequently, the detection period T is repeated successively one more time and latching for the second time is performed in response to the latch clock signal φD2 in the comparison phase of the detection period T. Then, the results may be combined to be determined.

Further, the magnetic sensor device according to the present invention may be used for alternation detection (for example, rotation detection of a motor). The magnetic sensor device for alternation detection is configured to switch from a state in which only one polarity (for example, S-pole) is detected to a state in which only another polarity (N-pole) is detected upon detection of the one polarity.

Also, the driving method according to the timing chart of FIG. 2 or 4 may be changed such that a predetermined standby period is provided between the detection period T and the subsequent detection period T so as to suppress an average current consumption of the magnetic sensor device, which produces the same effect.

What is claimed is:

1. A magnetic sensor device for generating a logic output according to a magnetic field intensity, comprising:
    a magnetoelectric conversion element to which the magnetic field intensity is applied;
    a comparator for comparing amplified output signals input thereto from the magnetoelectric conversion element, and outputting a comparison result;
    a first D-type flip-flop and a second D-type flip-flop each including an input terminal connected to an output terminal of the comparator;
    an XOR circuit including input terminals connected to an output terminal of the first D-type flip-flop and an output terminal of the second D-type flip-flop;
    a third D-type flip-flop; and
    a selector circuit including a first input terminal connected to the output terminal of the second D-type flip-flop, a second input terminal connected to an output terminal of the third D-type flip-flop, and a select terminal responsive to an output of the XOR circuit to selectively output, to the third D-type flip-flop, an input signal from the second D-type flip-flop and an input signal from the third D-type flip-flop.

2. A magnetic sensor device according to claim 1, further comprising:
    a switching circuit for switching between a first detection state and a second detection state of the magnetoelectric conversion element;
    a differential amplifier for amplifying a voltage difference between two output terminals of the switching circuit;
    a capacitor including one terminal connected to an output terminal of the differential amplifier, for holding an offset; and
    a switch connected to another terminal of the capacitor.

3. A magnetic sensor device according to claim 2, wherein:
    the selector circuit comprises:
    a first transmission gate connected to the first input terminal; and
    a second transmission gate connected to the second input terminal, and
    the selector circuit switches an output of the first transmission gate and an output of the second transmission gate and produces an output, in response to an input signal from the select terminal.

4. A magnetic sensor device according to claim 3, wherein the switching circuit has a function of switching between the first detection state and the second detection state, the first detection state corresponds to a state in which a supply voltage is input to a first terminal pair of the magnetoelectric conversion element and a detection voltage is output from a second terminal pair, and the second detection state corresponds to a state in which the supply voltage is input to the second terminal pair of the magnetoelectric conversion element and the detection voltage is output from the first terminal pair.

5. A magnetic sensor device according to claim 4, wherein the logic output is generated according to the magnetic field intensity applied to the magnetoelectric conversion element, the magnetic field intensity being varied among phases comprising a sample phase in which the offset is held in the capacitor during the first detection state, and a comparison phase in which the applied magnetic field intensity is compared with a reference voltage while the offset is canceled out during the second detection state.

6. A magnetic sensor device according to claim 5, wherein the first D-type flip-flop and the second D-type flip-flop perform latching in the same comparison phase.

7. A magnetic sensor device for generating a logic output according to a magnetic field intensity, comprising:
    a magnetoelectric conversion element to which the magnetic field intensity is applied;
    a comparator for comparing amplified output signals input thereto from the magnetoelectric conversion element, and outputting a comparison result;
    a first D-type flip-flop and a second D-type flip-flop each including an input terminal connected to an output terminal of the comparator;

a third D-type flip-flop including an input terminal connected to an output terminal of the first D-type flip-flop;

a fourth D-type flip-flop including an input terminal connected to an output terminal of the second D-type flip-flop;

a first XOR circuit including input terminals connected to an output terminal of the third D-type flip-flop and an output terminal of the fourth D-type flip-flop;

a second XOR circuit including input terminals connected to the output terminal of the first D-type flip-flop and the output terminal of the second D-type flip-flop;

a first OR circuit including input terminals connected to an output terminal of the first XOR circuit and an output terminal of the second XOR circuit;

a second OR circuit including input terminals connected to the output terminal of the second D-type flip-flop and the output terminal of the fourth D-type flip-flop;

a fifth D-type flip-flop; and a selector circuit including a first input terminal connected to an output terminal of the second OR circuit, a second input terminal connected to an output terminal of the fifth D-type flip-flop, and a select terminal responsive to an output of the first OR circuit to selectively output, to the fifth D-type flip-flop, an input signal from the second OR circuit and an input signal from the fifth D-type flip-flop.

8. A magnetic sensor device according to claim 7, further comprising:

a switching circuit for switching between a first detection state and a second detection state of the magnetoelectric conversion element;

a differential amplifier for amplifying a voltage difference between two output terminals of the switching circuit;

a capacitor including one terminal connected to an output terminal of the differential amplifier, for holding an offset; and a switch connected to another terminal of the capacitor.

9. A magnetic sensor device according to claim 8, wherein:

the selector circuit comprises:

a first transmission gate connected to the first input terminal; and a second transmission gate connected to the second input terminal, and the selector circuit switches an output of the first transmission gate and an output of the second transmission gate and produces an output, in response to an input signal from the select terminal.

10. A magnetic sensor device according to claim 9, wherein the switching circuit has a function of switching between the first detection state and the second detection state, the first detection state corresponds to a state in which a supply voltage is input to a first terminal pair of the magnetoelectric conversion element and a detection voltage is output from a second terminal pair, and the second detection state corresponds to a state in which the supply voltage is input to the second terminal pair of the magnetoelectric conversion element and the detection voltage is output from the first terminal pair.

11. A magnetic sensor device according to claim 10, wherein the logic output is generated according to the magnetic field intensity applied to the magnetoelectric conversion element, the magnetic field intensity being varied among phases comprising a sample phase in which the offset is held in the capacitor during the first detection state, and a comparison phase in which the applied magnetic field intensity is compared with a reference voltage while the offset is canceled out during the second detection state.

12. A magnetic sensor device according to claim 11, wherein the first D-type flip-flop and the second D-type flip-flop perform latching in the same comparison phase.

* * * * *